United States Patent
Ko

(10) Patent No.: US 7,723,187 B2
(45) Date of Patent: May 25, 2010

(54) SEMICONDUCTOR MEMORY DEVICE AND METHOD OF MANUFACTURING THE SAME

(75) Inventor: Youngsun Ko, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 100 days.

(21) Appl. No.: 12/120,282

(22) Filed: May 14, 2008

(65) Prior Publication Data

US 2009/0121274 A1     May 14, 2009

(30) Foreign Application Priority Data

May 25, 2007   (KR) .................. 10-2007-0050823

(51) Int. Cl.
*H01L 21/336*   (2006.01)
*H01L 29/788*   (2006.01)

(52) U.S. Cl. ...................... 438/265; 257/315

(58) Field of Classification Search .............. 438/201, 438/211, 257, 265; 257/315, 322, E29.131–E29.138, 257/E21.209, E21.682
See application file for complete search history.

(56) References Cited

U.S. PATENT DOCUMENTS 6,744,089 B2 * 6/2004 Wu ........................... 257/301
6,765,260 B1 * 7/2004 Hung et al. ................. 257/315

* cited by examiner

*Primary Examiner*—Calvin Lee
(74) *Attorney, Agent, or Firm*—Sherr & Vaughn, PLLC

(57) ABSTRACT

A salicide treatment is performed on a common source line to reduce surface resistance and contact resistance, thereby improving a cell current characteristic. Therefore, a chip can be reduced in size and chips per wafer can be increased, thereby achieving high yield. In addition, it is possible to overcome the structural limitation of the flash cell when the semiconductor memory device is highly integrated and shrunken.

18 Claims, 4 Drawing Sheets

SEMICONDUCTOR MEMORY DEVICE AND METHOD OF MANUFACTURING THE SAME

The present application claims priority under 35 U.S.C. §119 to Korean Patent Application No. 10-2007-0050823 (filed May 25, 2007), which is hereby incorporated by reference in its entirety.

BACKGROUND

A self-aligned source process may be used generally for forming a source line of a semiconductor memory device. During the self-aligned source process, after a stack gate structure is formed, a cell region excluding a common source portion may be covered with a photosensitive film, a device separation film at a source line portion is removed by etching, and ion implantation is performed to form a common source line.

Figure 1:
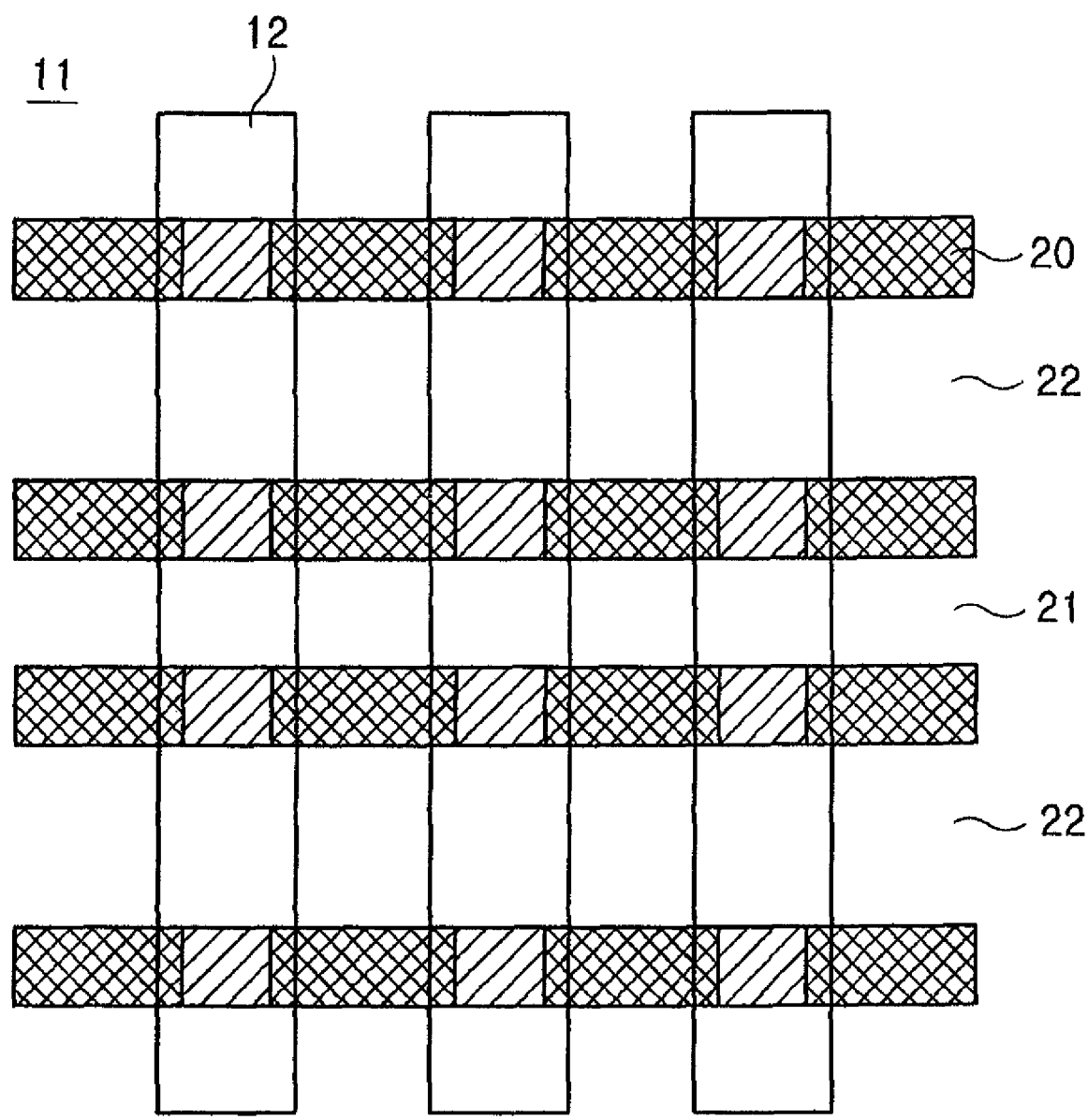
Figure 2A:
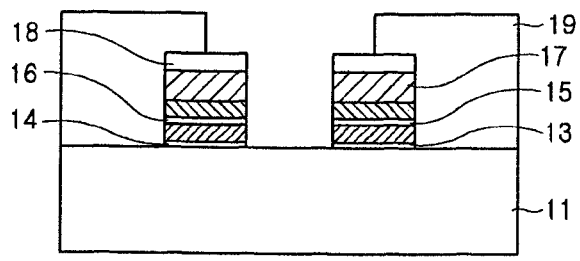

As illustrated in example FIGS. 1 and 2A, device separation film 12 may be formed at a device separation region on and/or oversemiconductor substrate 11. Tunnel oxide film 13 and first polysilicon film 14 may be sequentially formed on and/or over the entire structure and then patterned by a lithography process and an etching process with a floating gate mask, thereby forming a floating gate.

Dielectric film 15, second polysilicon film 16, tungsten silicide film 17, and oxide film 18 may then be sequentially formed on and/or over the entire structure and then patterned by a lithography process and an etching process with a control gate mask, thereby forming a control gate. Therefore, stack gate structure 20 in which a floating gate and a control gate are laminated may be formed. Photosensitive film 19 may then be formed over the entire structure and then patterned by an exposure process and a development process with a self-aligned source mask, such that the source portion is exposed.

Figure 2B:
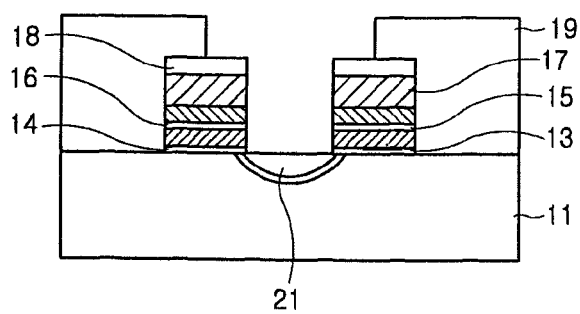

As illustrated in example FIGS. 1 and 2B, exposed device separation film 12 at the source line portion may then be removed by a self-aligned source (SAS) etching process, thereby exposing semiconductor substrate 11 at the source line portion. After the self-aligned source etching process is completed, a curing process may be performed. A cell source ion implantation process may be performed with patterned photosensitive film 19 as an ion implantation mask. Then, impurity ions may be implanted into semiconductor substrate 11 at the source line portion, thereby forming common source line 21.

Figure 2C:
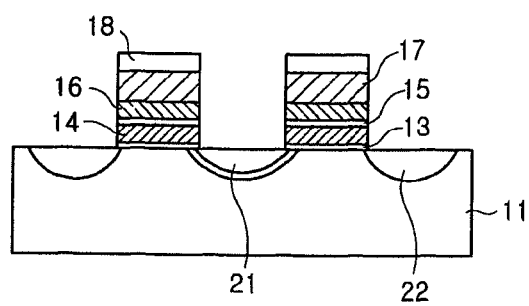

As illustrated in example FIGS. 1 and 2C, the entire cell array may then be exposed and an impurity ion implantation process is performed, thereby forming drain region 22.

Figure 2D:
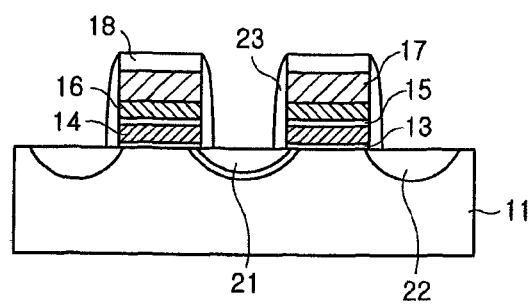

As illustrated in example FIGS. 1 and 2D, an insulating film may then be formed on and/or over the entire structure and an entire surface etching process is then performed, thereby forming spacer 23 on each sidewall of stack gate structure 20.

In such a structure, since multiple cells are connected to a single source line, i.e., the common source line is used, source resistance may be large. Accordingly, a cell current characteristic may be deteriorated.

SUMMARY

Embodiments relate to a semiconductor device and a method of manufacturing the semiconductor memory device which can reduce high source resistance due to a self-aligned source process for high integration, thereby improving a cell current characteristic.

Embodiments relate to a method of manufacturing a semiconductor memory device that can reduce resistance by performing a self-aligned silicide (salicide) treatment on a common source line, thereby improving a cell current characteristic.

Embodiments relate to a method of manufacturing a semiconductor memory device which can include at least one of the following steps: forming a stack gate structure including a floating gate and a control gate, a common source line and a drain region on and/or over a semiconductor substrate; and then forming an insulating film on and/or over the stack gate structure, the common source line, and the drain region, and reducing the thickness of the insulating film formed at a sidewall of the stack gate structure toward the common source line; and then etching the insulating film to expose the common source line and the drain region, and forming spacers on the sidewalls of the stack gate structure; and then forming a silicide layer on and/or over the surface of the exposed common source line.

A photosensitive film can be formed on and/or over the stack gate structure, the common source line, and the drain region, and then patterned to expose an upper region of the common source line. The insulating film exposed by the patterned photosensitive film can be partially etched. When reducing the thickness of the insulating film formed on and/or over the sidewall of the stack gate structure toward the common source line, an entire surface etching process can be performed such that the spacer toward the drain region becomes wider than the spacer toward the common source line.

A self-aligned silicide (salicide) prevention film can be formed on and/or over the entire structure excluding the upper region of the common source line, and a salicide process can be performed on and/or over the exposed common source line to form a silicide layer. A photosensitive film can be formed on and/or over the entire structure, in which the spacers are formed, and then patterned to expose the entire region excluding the upper region of the common source line. The salicide prevention film can be formed in the region exposed by the patterned photosensitive film. The silicide layer can be formed by sequentially laminating cobalt, titanium, and titanium nitride with thicknesses of 140 to 160 Å, 180 to 220 Å, and 200 to 240 Å, respectively, and by performing annealing at 440 to 520° C. for 50 to 70 seconds under nitrogen ($N_2$) atmosphere by using rapid thermal annealing equipment.

Embodiments relate to a semiconductor memory device that can include at least one of the following: a stack gate structure including a floating gate and a control gate, a common source line and a drain region formed on and/or over a semiconductor substrate; spacers formed on and/or over the sidewalls of the stack gate structure; and a silicide layer formed on and/or over the surface of the common source line.

DRAWINGS

Example FIGS. 1 to 2 illustrate a semiconductor memory cell array and a method of manufacturing a semiconductor memory device.

Example FIGS. 3A to 3G illustrate a method of manufacturing a semiconductor memory device, in accordance with embodiments.

DESCRIPTION

Figure 3A:
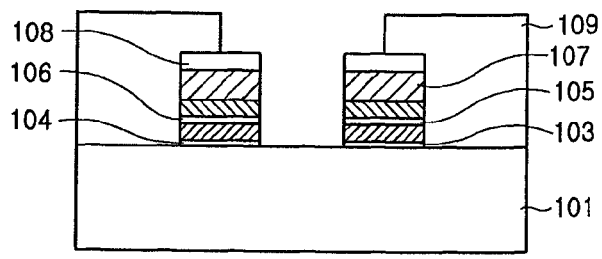

As illustrated in example FIG. 3A, a device separation film can be formed in a device separation region of semiconductor substrate 101. Tunnel oxide film 103 and first polysilicon film 104 can then be sequentially formed on and/or over the entire structure and then patterned by a lithography process and an etching process with a floating gate mask, thereby forming a floating gate. Dielectric film 105, second polysilicon film 106, tungsten silicide film 107 and oxide film 108 can then be sequentially formed on and/or over the entire structure and then patterned by a lithography process and an etching process with a control gate mask, thereby forming a control gate. In this way, a stack gate structure including a floating gate and a control gate are laminated can be formed. Photosensitive film 109 can then be formed on and/or over the entire structure and then patterned by an exposure process and a development process with a self-aligned source mask so as to expose a source line region in substrate 101.

Figure 3B:
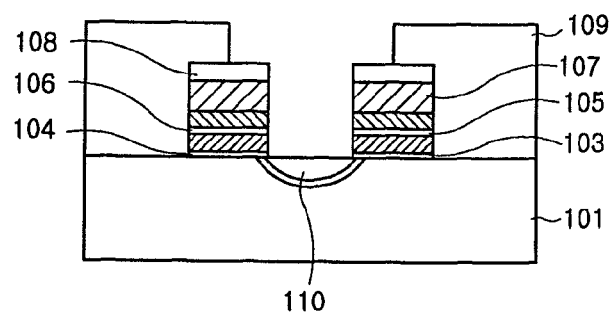

As illustrated in example FIG. 3B, a self-aligned source etching process can then be performed to remove the exposed device separation film at the source line region exposing semiconductor substrate 101 at the source line region. After the self-aligned source etching process is completed, a curing process is performed. A cell source ion implantation process can then be performed with patterned photosensitive film 109 as an ion implantation mask and impurity ions implanted into semiconductor substrate 101 at the source line region, thereby forming common source line 110.

Figure 3C:
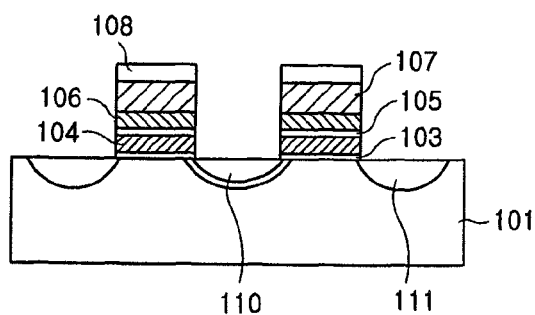

As illustrated in example FIG. 3C, the entire cell array can then be exposed and an impurity ion implantation process performed, thereby forming drain region 111 in substrate 101.

Figure 3D:
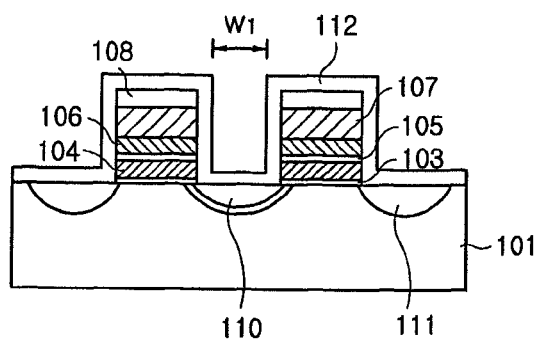

As illustrated in example FIG. 3D, for the purpose of forming spacers on and/or over the sidewalls of the stack gate structure, insulating film 112 can then be formed on and/or over the entire structure. Instead of performing a surface etching process immediately after forming insulating film 112, in accordance with embodiments, the entire surface etching process is not performed immediately after forming insulating film 112.

Figure 3E:
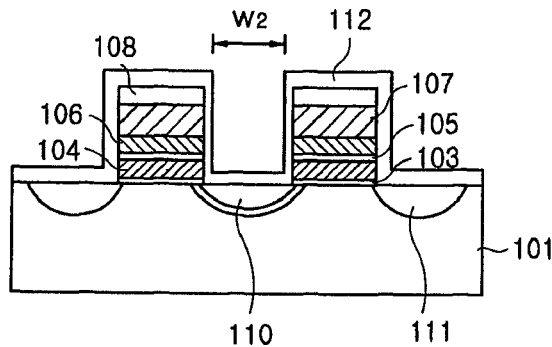

As illustrated in example FIG. 3E, a photosensitive film can then be formed on and/or over the entire structure and then patterned to expose the upper region of common source line 110. Insulating film 112 exposed by the patterned photosensitive film can then be partially etched to reduce the thickness of insulating film 112 on a sidewall of the stack gate structure. Meaning, a width at which the upper region of common source line 110 is exposed (hereinafter, referred to as "exposure width") is increased (W1<W2). The exposure width is increased to enable better performance of a subsequent self-aligned silicide (salicide) process. Meaning, as semiconductor memory devices become highly integrated and thinner, it is difficult to better perform the subsequent salicide process due to the narrow exposure width of the upper region of common source line 110.

Figure 3F:
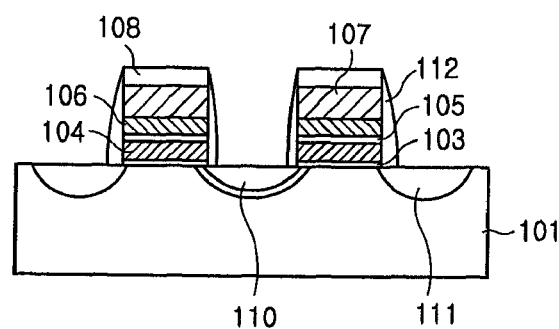

As illustrated in example FIG. 3F, an entire surface etching process can then be performed to form spacers 112 on the sidewalls of the stack gate structure. In accordance with embodiments, spacers 112 on both sidewalls of the stack gate structure can have different thicknesses. In essence, the spacer adjacent to drain 111 is wider than the spacer adjacent common source line 110.

Figure 3G:
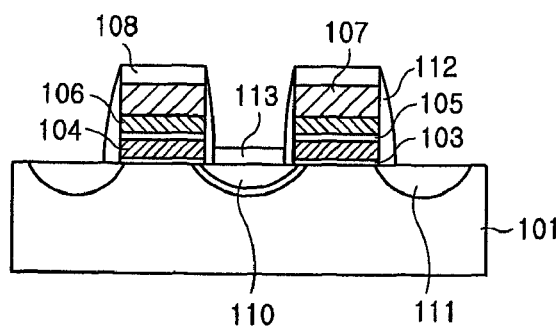

As illustrated in example FIG. 3G, a photosensitive film can then be formed on and/or over the entire surface and then patterned to expose a region excluding the upper region of common source line 110. A salicide prevention film such as a TEOS film can then be formed in the region exposed by the patterned photosensitive film. After the photosensitive film on and/or over the upper region of common source line 110 is removed, a salicide process can be performed to form silicide layer 113 on and/or over the surface of common source line 110. Silicide layer 113 can be formed by sequentially laminating a first metal layer such as cobalt (Co) at a thickness of 140 to 160 Å, a second metal layer such as titanium (Ti) at a thickness of 180 to 220 Å, and a third metal layer such as titanium nitride (TiN) at a thickness of 200 to 240 Å and performing an annealing process at 440 to 520° C. for 50 to 70 seconds under a nitrogen ($N_2$) atmosphere. Alternatively, the silicide layer can be formed by sequentially laminating cobalt (Co) at a thickness of 150 Å, titanium (Ti) at a thickness of 200 Å and titanium nitride (TiN) at a thickness of, 220 Å and performing an annealing process at 480° C. for 60 seconds. In this way, silicide layer 113 can be formed on and/or over common source line 110 to reduce surface resistance and contact resistance of common source line 110. Thereafter, the salicide prevention film can be removed.

As described above, in accordance with embodiments, a salicide treatment can be performed on the common source line of a semiconductor memory device to reduce surface resistance and contact resistance. As a result, the cell current characteristic can be improved. Therefore, the chip can be reduced in size and chips per wafer can be increased, thereby achieving high yield. In addition, it is possible to overcome the structural limitation of the flash cell when the semiconductor memory device is highly integrated and thinner.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor memory device comprising:

forming a stack gate structure including a floating gate and a control gate on a semiconductor substrate; and then forming a common source line and a drain region in the semiconductor substrate; and then forming an insulating film on the semiconductor substrate including the stack gate structure, the common source line, and the drain region and reducing the thickness of the insulating film formed at a sidewall of the stack gate structure adjacent the common source line; and then forming spacers on the sidewalls of the stack gate structure by etching the insulating film to expose the common source line and the drain region; and then forming a silicide layer on the surface of the exposed common source line.

2. The method of claim 1, wherein forming the insulating film comprises:

forming a photosensitive film on the stack gate structure, the common source line, and the drain region; and then patterning the photosensitive film to expose an upper region of the common source line; and then partially etching the insulating film exposed by the patterned photosensitive film.

3. The method of claim 1, wherein forming the spacers comprises:

performing a surface etching process such that one of the spacers adjacent the drain region is wider than another of the spacers adjacent the common source line.

4. The method of claim 1, wherein forming the silicide layer comprises:
  forming a salicide prevention film on the entire surface of the semiconductor substrate excluding the upper region of the common source line; and then
  performing a self-aligned silicide process on the exposed common source line to form the silicide layer.

5. The method of claim 4, wherein forming the salicide prevention film comprises:
  forming a photosensitive film on the entire surface of the semiconductor substrate; and then
  patterning the photosensitive film to expose the entire surface of the semiconductor substrate excluding the upper region of the common source line; and then
  forming the salicide prevention film in the region exposed by the patterned photosensitive film.

6. The method of claim 4, wherein forming the silicide layer comprises sequentially laminating cobalt at a thickness of 140 to 160 Å, titanium at a thickness of 180 to 220 Å and titanium nitride at a thickness of 200 to 240 Å.

7. The method of claim 6, wherein forming the silicide layer further comprises performing a rapid thermal annealing process at 440 to 520° C. for 50 to 70 seconds under a nitrogen ($N_2$) atmosphere.

8. The method of claim 1, wherein forming the silicide layer comprises sequentially laminating cobalt at a thickness of 140 to 160 Å, titanium at a thickness of 180 to 220 Å and titanium nitride at a thickness of 200 to 240 Å.

9. The method of claim 8, wherein forming the silicide layer further comprises performing a rapid thermal annealing process at 440 to 520° C. for 50 to 70 seconds under a nitrogen ($N_2$) atmosphere.

10. A method of forming a semiconductor device comprising:
  forming a stack gate structure including a floating gate directly on and contacting the semiconductor substrate and a control gate directly on and contacting the floating gate; and then
  forming a common source line and a drain region in the semiconductor substrate; and then
  forming a first spacer having a first width between the first spacers adjacent the common source line and a second spacer having a second width between the second spacers adjacent the drain region on the sidewalls of the stack gate structure, wherein the second width is greater than the first width; and then
  forming a silicide layer directly on and contacting the common source line.

11. The method of claim 10, wherein forming the first and second spacers comprises:
  forming an insulating film on the semiconductor substrate including the stack gate entire, the common source line and the drain region; and then
  forming a photosensitive film on the insulating film and patterning the photosensitive film to expose a portion of the insulating film formed on the sidewall of the stack gate structure adjacent the common source line; and then
  performing a first etching process partially etching the exposed portion of the insulating film formed on the sidewall; and then
  performing a second etching process to form the first and second spacers.

12. The method of claim 10, wherein the salicide layer also contacts the first spacer.

13. The method of claim 10, wherein forming silicide layer comprises:
  sequentially forming a first metal layer, a second metal layer and a third metal layer on the common source line; and then
  performing an annealing process at 440 to 520° C. for 50 to 70 seconds under an $N_2$ atmosphere.

14. The method of claim 13, wherein the first metal layer is formed at a thickness of 140 to 160 Å, the second metal layer is formed at a thickness of 180 to 220 Å and the third metal layer is formed at a thickness of 200 to 240 Å.

15. The method of claim 14, wherein the first metal layer comprises cobalt, the second metal layer comprises titanium and the third metal layer comprises titanium nitride.

16. The method of claim 10, wherein forming silicide layer comprises:
  sequentially forming a first metal layer, a second metal layer and a third metal layer on the common source line; and then
  performing a rapid thermal annealing process at 480° C. for 60 seconds under an $N_2$ atmosphere.

17. The method of claim 16, wherein the first metal layer is formed at a thickness of 150 Å, the second metal layer is formed at a thickness of 200 Å and the third metal layer is formed at a thickness of 220 Å.

18. The method of claim 17, wherein the first metal layer comprises cobalt, the second metal layer comprises titanium and the third metal layer comprises titanium nitride.

* * * * *